United States Patent [19]

Herrmann et al.

[11] Patent Number: 4,685,991
[45] Date of Patent: Aug. 11, 1987

[54] PROCESS AND APPARATUS FOR PEELING A PROTECTIVE FILM FROM AN EXPOSED PHOTORESIST COATING ON A PRINTED CIRCUIT BOARD

[75] Inventors: Gunter Herrmann, Wiernsheim; Hans-Günter Löhr, Calw; Josef W. Mozzi, Schwieberdingen, all of Fed. Rep. of Germany

[73] Assignee: Lohr & Herrmann GmbH, Neuhausen, Fed. Rep. of Germany

[21] Appl. No.: 890,699

[22] Filed: Jul. 25, 1986

[30] Foreign Application Priority Data

Sep. 12, 1985 [DE] Fed. Rep. of Germany ....... 3532553

[51] Int. Cl.[4] .............................................. B32B 31/16
[52] U.S. Cl. .................................... 156/344; 156/584; 430/256
[58] Field of Search ................. 156/344, 584; 430/256

[56] References Cited

U.S. PATENT DOCUMENTS

| | | | |
|---|---|---|---|
| 3,404,057 | 10/1968 | Heiart | 156/584 X |
| 3,451,872 | 6/1969 | Townsend | 156/344 X |
| 3,996,127 | 12/1976 | Rautimo et al. | 156/584 X |
| 4,183,751 | 1/1980 | Matsumoto et al. | 156/584 X |
| 4,631,110 | 12/1986 | Tsumura et al. | 430/256 X |

FOREIGN PATENT DOCUMENTS

3339723 5/1985 Fed. Rep. of Germany .

*Primary Examiner*—Robert A. Dawson
*Attorney, Agent, or Firm*—Balogh, Osann, Kramer, Dvorak, Genova & Traub

[57] ABSTRACT

The apparatus comprises a board-clamping device for clamping a printed circuit board at an edge thereof in a predetermined position, at least one pair of gripping jaws, which can be moved toward and away from the plane of travel for the printed circuit boards by a movement having a component in the peeling direction, which is oblique to the direction of conveyance. The two gripping jaws of said pair are adapted to be closed in that only one jaw of said pair is moved in the peeling direction. Each of the jaws of the pair has an edge which is parallel to the plane of travel and transverse to the peeling direction. Said edge is engageable with the printed circuit board. Said edges of the gripping jaws of said pair define between them a nip. The apparatus also comprises a conveyor, which defines a plane of travel for each printed circuit board and serves to move each printed circuit board to a position in which the printed circuit board is engageable by the gripping jaws of said pair thereof.

20 Claims, 12 Drawing Figures

PROCESS AND APPARATUS FOR PEELING A PROTECTIVE FILM FROM AN EXPOSED PHOTORESIST COATING ON A PRINTED CIRCUIT BOARD

BACKGROUND OF THE INVENTION

1. Field of the Invention

This invention relates to a process and apparatus for peeling a protective film from an exposed photoresist coating on a printed circuit board, which peeling begins at one corner of the protective film and terminates at the diagonally opposite corner.

2. Description of the Prior Art

It is known that such protective films can be peeled off by hand. For this purpose a knife or fingernail is used to detach the protective film at one corner from the underlying photoresist coating, the triangular corner portion which has been separated is gripped with two fingers and the protective film is then peeled off entirely. But that practice often results in damage to the photoresist coating by the knife edge or fingernail and may result in a tearing or cutting into the protective film, which is notch-sensitive, so that the film may be torn or may even be torn off as it is peeled off.

Published German Application No. 33 39 723 discloses an apparatus for detaching and peeling off the protective film in that adhesive tapes are stuck to the protective film and are used to peel off the film from one corner to the diagonally opposite corner. In the known apparatus the application of the adhesive tapes and the peeling of the protective film are performed as the printed circuit board is supported in a horizontal orientation and advanced by a horizontal conveyor, which constitutes a roller conveyor. A disadvantage of the known apparatus resides in that the adhesive tapes may detach from the protective film as the latter is peeled off so that the sequence of operations may be disturbed. Such disturbances are not tolerable in a substantially automated production line.

From Published German Application No. 27 47 265 it is known to peel off a protective film from a photopolymer which has been laminated to a substrate material. An adhesive tape fixed by means of rollers to the protective film is used to peel off the protective film. That operation is not reliable and may give rise to disturbances in a continuous operation.

SUMMARY OF THE INVENTION

It is an object of the invention to provide for the peeling of a protective film from a photoresist coating on a printed circuit board a process and an apparatus by which the protective film can initially be detached at one corner substantially without a risk of damage to the photoresist coating and can then reliably be peeled off. The process is particularly intended to be adaptable to automation.

In a process of peeling a protective film from an exposed photoresist coating on a printed circuit board, which peeling begins at one corner of the protective film and terminates at the diagonally opposite corner, that object is accomplished in that the printed circuit board is fixed in a predetermined position, a first gripping member is caused to apply pressure to the protective film close to the corner at which the peeling is to begin, said pressure is sufficient to squeeze the photoresist disposed between the first gripping member and the printed circuit board, a second gripping member is moved in contact with the printed circuit board toward the first gripping member and is used to peel off the photoresist coating which lies ahead of the squeezed portion and the protective film is subsequently peeled from the photoresist coating.

In an apparatus for peeling a protective film from an exposed photoresist coating on a printed circuit board, which peeling begins at one corner of the protective film and terminates at the diagonally opposite corner, which apparatus comprises a conveyor for conveying the printed circuit board in a direction of travel to a peeling device, which conveyor defines a plane of travel for the printed circuit board, the object set forth hereinbefore is accomplished by the provision of a board-clamping for clamping the printed circuit board at its edge and for holding the printed circuit board in a predetermined position, and at least one pair of gripping jaws, which consist of a squeezing jaw and a detaching jaw and are movable in a peeling direction at an oblique angle to the direction of travel, and adapted to be closed in that a movement in the peeling direction is imparted only to the detaching jaw, wherein each of said two jaws comprises an edge which extends parallel to the plane of travel and transverse to the peeling direction and defines a nip between the jaws and is engageable with the printed circuit board.

Further features of the invention will be recited in the dependent claims.

In accordance with the invention one corner of the laminate consisting of the photoresist coating and the protective film is detached from the printed circuit board. That corner portion is gripped in order to peel off the protective film. To ensure that only the protective film will be peeled off whereas the photoresist coating will almost entirely remain on the printed circuit board, the photoresist coating is squeezed before the corner portion is detached. As a result, the squeezed portion of the photoresist coating is torn from the remaining portion of the photoresist coating as soon as a pull is exerted on the detached corner portion so that only the protective film will be peeled off. The detaching of a small corner portion of the photoresist coating is tolerable because a marginal strip of the photoresist coating will not be required to be exposed for photographic purposes.

The squeezing of the photoresist layer in a narrow strip thereoff will ensure that the photoresist coating will be torn off exactly at that point and there will be no damage to the main portion of the photoresist coating, i.e., to that portion thereof which adjoins that squeezed strip.

The operations of detaching a corner portion of the laminate consisting of the protective film and the photoresist coating and subsequently peeling off the protective film alone can be at least substantially automatically performed by means of a pair of gripping jaws provided in the apparatus in accordance with the invention. In the apparatus in accordance with the invention the printed circuit board provided with the protective film which is to be peeled off is moved on the conveyor to a position adjacent to the pair of gripping jaws and is then moved to such a predetermined position relative to said pair of gripping jaws that the nip-defining edge of the squeezing jaw engages the protective film from above and extends from one edge to the other of those edges of the protective film which define the corner portion which is to be detached. That nip-defining edge applies pressure to the printed circuit board so as to squeeze the underlying portion of the photoresist coating and should be spaced about 1 cm apart from the adjacent corner of the protective film. The detaching jaw is parallel to and faces the squeezing jaw and engages the printed circuit board outside the protective film and the photoresist coating. To detach the protective film, the detaching jaw is moved toward the squeezing jaw while the latter remains stationary. As a result, a corner portion of the laminate consisting of the protective film and the photoresist coating is detached from the printed circuit board and is gripped between the two gripping jaws. For this operation the detaching jaw which performs the closing movement is slightly closer to the plane of travel for the printed circuit board, approximately by the thickness of the protective film, than the squeezing jaw. As a result, when the detaching jaw rests on the printed circuit board the squeezing jaw will sufficiently squeeze the photoresist coating but will not damage the protective film. Squeezing could be effected along a line. But because the protective film is usually notchsensitive, the photoresist coating is suitable squeezed by means of a surface having the shape of a narrow strip so that a notching of the protective film will be avoided. The squeezing of such a narrow strip is suitably effected by means of a narrow surface portion which is formed on the squeezing jaw and parallel to the plane of travel. Said strip-shaped surface portion of the squeezing jaw should be adjoined by a surface which faces the plane of travel and extends at a clearance angle of, e.g., 4 degrees, so that the squeezing jaw will not apply pressure to the protective film in a larger area than is required.

To ensure that the detaching jaw can satisfactorily perform its detaching function, that surface of the detaching jaw which faces the plane of travel is suitably inclined relative to the plane of travel, suitably at a cutting angle of 4 degrees.

Adjacent to the nip between the two gripping jaws, one of them suitably has an undercut into which material of the photoresist layer can flow as the gripping jaws are forced against each other.

To peel off the protective film, the two gripping jaws are raised and moved along a path which has a component in the direction toward the opposite corner of the protective film. The direction of that component of motion is parallel to the plane of travel of the printed circuit board and will be described herein as the peeling direction, which is suitably oblique to the direction of travel of the printed circuit board on the conveyor. The printed circuit board is held in a fixed position during the peeling operation. Alternatively, the protective film might be peeled off in a direction which is at right angles to the direction of travel of the printed circuit boards; in that case the printed circuit board will be moved by the conveyor in the direction of travel during the peeling operation so that the protective film will also be peeled off in a diagonal direction from one corner to the diagonally opposite corner. Apparatus for performing the operation described last will require a higher structural expenditure.

The entire peeling operation might be performed by means of the two gripping jaws which detach the first corner portion from the printed circuit board. But said two gripping jaws are preferably used only to initiate the peeling movement, whereafter the detached corner portion of the protective film is transferred to a separate gripper, which is suitably movable along a straight line at a constant distance from the plane of travel for the printed circuit board and said gripper is then used to perform a major part of the peeling movement. That gripper may be relatively simple and mechanically actuated and can easily be moved along a straight path whereas a peeling effected by the two gripping jaws would involve a complicated sequence of movements because the gripping jaws must be capable of various adjustments in adaptation to different types of printed circuit boards so that said peeling movement would have to be imparted also to the means for opening and closing the two gripping jaws and to the means for adjusting said jaws. As a result, the means for imparting such peeling movement to the two gripping jaws would require a much more expensive structure than the means for imparting the peeling movement to a separate gripper. In dependence on the length and width of the printed circuit board, the length of said peeling movement may be as large as or in excess of one meter.

Such a gripper for taking over the protective film from the two gripping jaws must obviously be moved to a receiving position close to the gripping jaws. The gripper suitably comprises two forked pairs of fingers, which are disposed on opposite sides of the gripping jaws in their transfer position so that the fingers can engage the raised corner portion of the protective film on opposite sides of the pair of gripping jaws. When the protective film has been gripped by the gripper, the latter will be operated to pull the protective film out of the nip between the gripping jaws, which have been relieved from pressure, and to peel off the protective film from the printed circuit board in an oblique direction.

The device for clamping the printed circuit board might be stationary and disposed adjacent to the two gripping jaws. But in that case the printed circuit board would have to be moved to the required position when the board is near the gripping jaws, i.e., in a region which cannot easily be inspected. That position of the printed circuit board must be so determined that the gripping jaws can actually grip a corner portion of the protective film. In a preferred arrangement the board-clamping device is movable in the direction of travel and can be fixed in position. In that case the printed circuit board can be adjusted to the desired position when the board is outside the region of the gripping jaws but within the area in which the printed circuit board can be clamped by the displaceable board-clamping device and can then be moved by that device over a predetermined distance, which is always the same and is so selected that the printed circuit board will reliably be moved to the required end position in which the printed circuit board can be engaged by the two gripping jaws. When the printed circuit board has reached that position, the board-clamping device is arrested and remains arrested during the peeling operation. The board-clamping device suitably clamps the printed circuit board close to that corner at which the peeling operation is to be initiated particularly at that longitudinal edge of the printed circuit board which extends in the direction of travel, because in that case the peeling movement will be performed in a desirable manner in the direction which leads away from the point at which the printed circuit board is clamped.

On principle, the invention is applicable to printed circuit boards which have a horizontal orientation or stand on edge or are inclined as they are conveyed. The apparatus preferably comprises a horizontal conveyor, on which the printed circuit boards are conveyed in a horizontal orientation, preferably on a bed formed by a plurality of rollers, at least part of which are driven and which define a common upper tangential plane, which constitutes the plane of travel for the printed circuit board. The gripper for peeling off the protective film is moved over the plane of travel in a direction which is oblique to the direction of travel and said gripper is preferably moved to a region which is outside the horizontal conveyor. This will afford the advantage that when the protective film has been peeled off and hangs down from the gripper that protective film can be dropped most conveniently into a collecting bin disposed outside the horizontal conveyor simply in that the gripper is opened.

As many printed circuit boards are provided on both sides with a photoresist coating which is covered with a protective film, it is often necessary to peel off a protective film from each of both sides of a printed circuit board. It has surprisingly been found that the protective film can be peeled from the underside of a printed circuit board which lies on a bed of rollers if adjacent rollers said bed are spaced apart by a gap which extends in the peeling direction, and the gripper for peeling off the lower protective film can be moved in said gap along the same as close as possible to the plane of underside surface of the printed circuit board. In that case the beginning of the peeling operation can preferably be facilitated in that the printed circuit board is slightly raised by means of the board-clamping device which is anyway provided. It is sufficient to raise the board by two millimeters. When the gripper has reversely bent the initially detached corner portion of the protective film and has inserted said corner portion between the underside of the printed circuit board and the bed of rollers, the gripper can complete the peeling operation even when the printed circuit board has been lowered to rest on the rollers.

As has been mentioned, two gripping jaws must be used in any case to detach the protective film. When said two gripping jaws have gripped a corner portion of the film, said jaws move away from the printed circuit board in a movement which has a component in the peeling direction. For this purpose a pivotal movement is preferably imparted to said two gripping jaws by parallel links, which are pivotally movable about pivotal axes which are transverse to the peeling direction and hold the pair of gripping jaws in a predetermined orientation during their pivotal movement so that the gripping jaws will always have the same orientation when they engage the surface of the printed circuit board regardless of the thickness of the printed circuit board. That arrangement ensures also that the protective film will not be kinked as it is gripped so that a tearing of the protective film will be prevented. That edge of the squeezing jaw about which the protective film is bent should be rounded rather than sharp so that it will not notch the protective film. The radius of curvature of said edge may be very small; it will be sufficient to stone the edge.

DETAILED DESCRIPTION OF THE PREFERRED EMBODIMENTS

Figure 1:
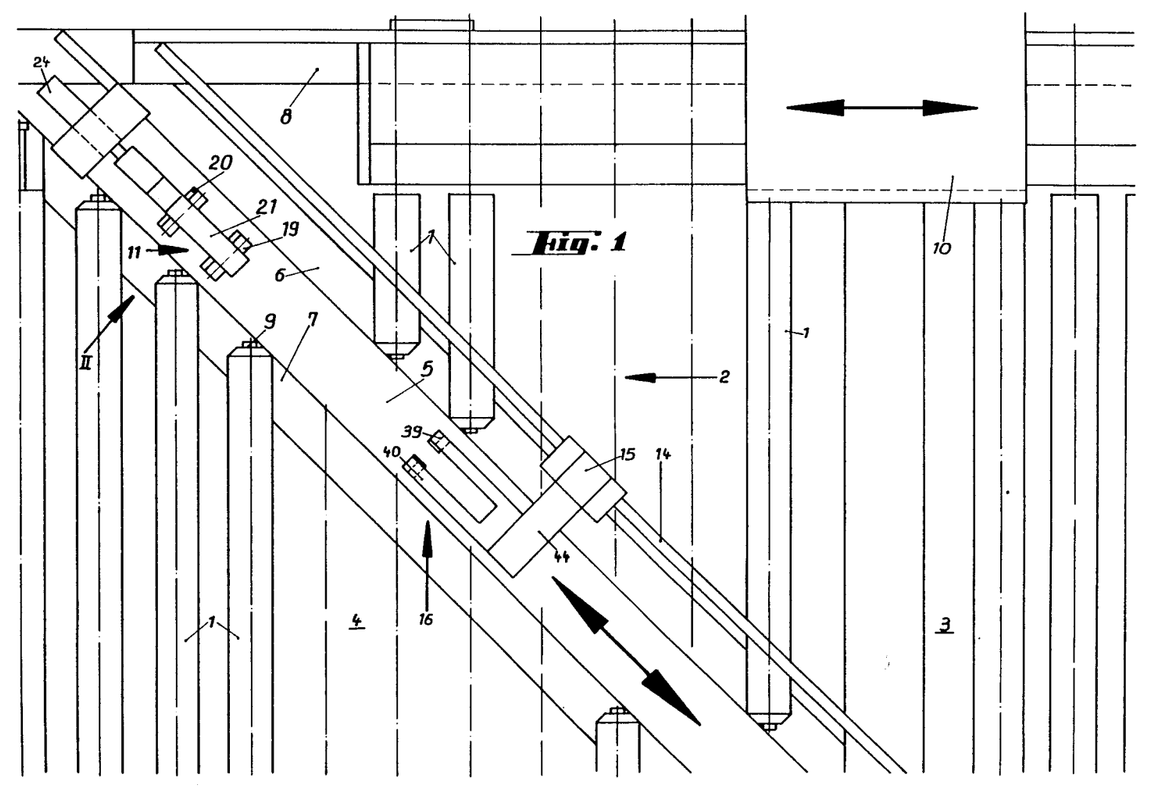
FIG. 1 is a portion of a top plan view showing apparatus for peeling off protective films from printed circuit boards.

FIG. 1 is a top plan view showing a portion of a horizontal conveyor, which comprises a bed consisting of rollers 1, which are synchronously driven to rotate about horizontal axes. The direction of travel imparted by the rollers to the printed circuit boards is indicated by the arrow 2. The roller bed consists of two sections 3 and 4, which are separated by a gap 5, which is oblique to the direction of travel 2 and in the present embodiment extends at an angle of 45° to said direction. The gap 5 between the two portions 3 and 4 is defined by two parallel horizontal beams 6 and 7, which are oblique to the direction of travel 2 and are secured to lateral frame members 8 of the apparatus and provided with upstanding lugs 9 for mounting the rollers at their inner ends, which are disposed over the beams 6 and 7. The rollers are mounted at their outer ends over the lateral frame members 8.

A board-clamping device 10 is mounted on that lateral frame member 8 which is disposed on the right when viewed in the direction of travel 2. The board-clamping device is movable in the direction of travel 2 and opposite to said direction and is operable to clamp the printed circuit board at the adjacent edge, which is parallel to the direction of travel 2, and to move the clamped board into the range of action of two paris of gripping jaws 11 and 12, which are respectively disposed above and below the plane of travel 13 for the printed circuit board and adjacent to the gap 5. The board-clamping device 10 is adapted to be fixed in position when the printed circuit board is in that range of action. The plane of travel is defined by the common tangetial plane of the rollers 1.

A carriage 15 is reciprocable on a guide rail 14, which is parallel to the beam 6 is disposed above the rollers 1. The carriage 15 carries two grippers 16, which are respectively disposed above and below the plane of travel 13.

Figure 2:
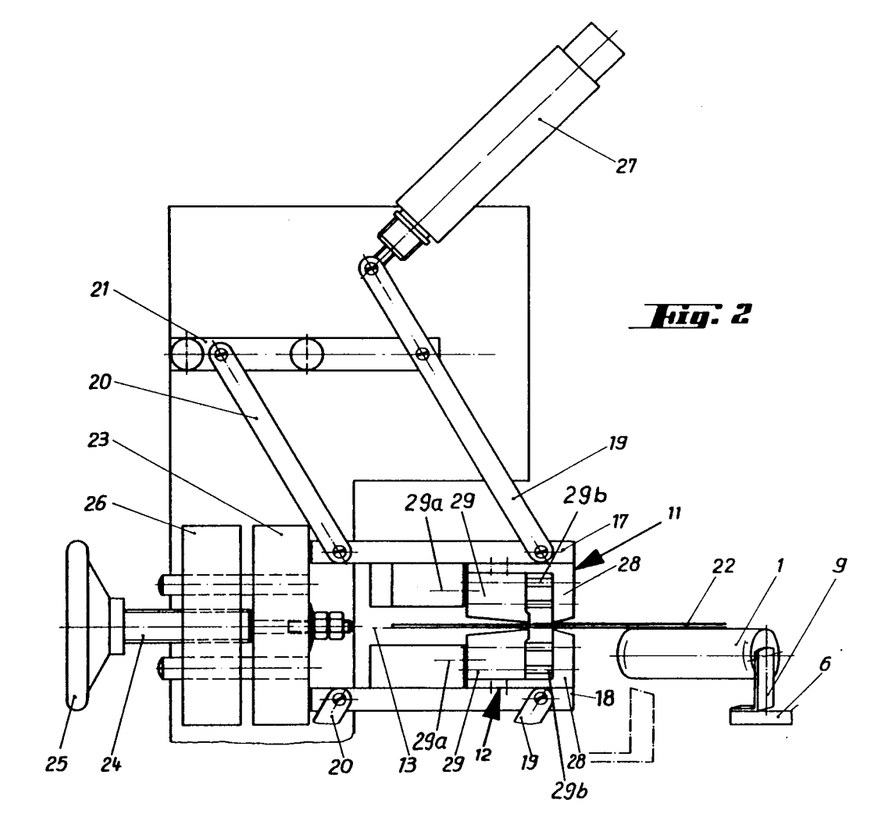
FIG. 2 is an elevation showing a detail viewed in the direction of the arrow II in FIG. 1 with the two gripping jaws for detaching a corner portion of a protective film.

FIG. 2 shows as a detail how the pairs of gripping jaws 11 and 12 are disposed above and below the plane of travel 13, respectively. The gripping jaws of each pair are mounted on a plate 17 or 18, which is pivotally movable toward and away from the plane of travel 13 by parallel links 19 and 20, which are pivoted to a frame member 21. The links 19 and 20 constrain the plates 17 and 18 to remain parallel to the plane of travel 13 during the pivotal movement of the plates 17 and 18. The pairs of gripping jaws are intended to engage the adjacent printed circuit board 22 when the plates 17 and 18 are in the end position shown in FIG. 2. That end position is defined by a stop block 23, which is adjustable by means of a screw 24, which is operable by means of a handwheel 25. The screw is screwed into a nut 26, which is fixed to the mainframe of the apparatus.

A pivotal movement can be imparted to the plates 17 and 18 by means of a pneumatic piston-cylinder unit 27, which engages one of the two links 19. That link consists of a two-armed lever.

One of the two gripping jaws 28 and 29 of each pair, specifically the squeezing jaw 28, is immovably mounted on the associated plate 17 or 18. The other jaw 29 constitutes a detaching jaw and is mounted to be movable in the plane of its mounting plate 17 or 18 in order to close and open the pair of gripping jaws.

Figure 3:
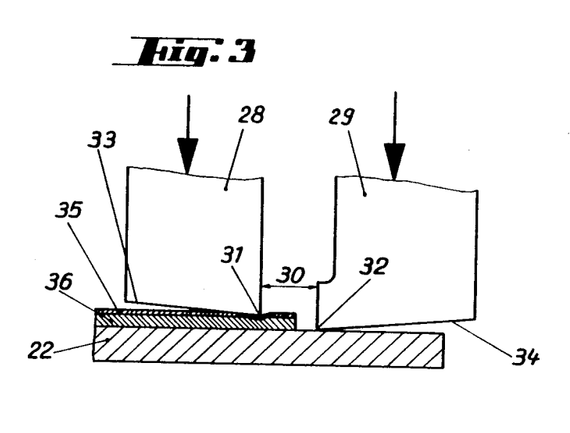
FIGS. 3 to 6 show four consecutive phases of the operation by which a corner portion of a protective film is detached.
Figure 4:
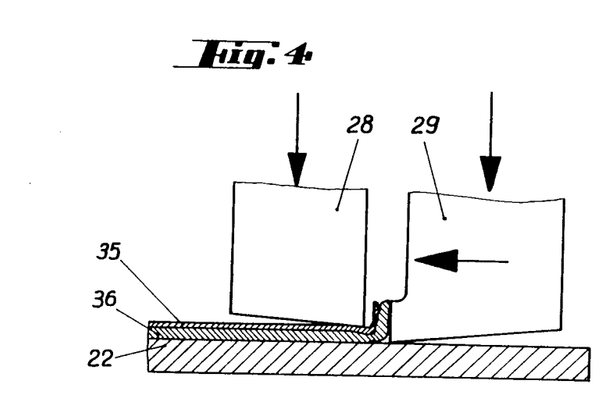
Figure 5:
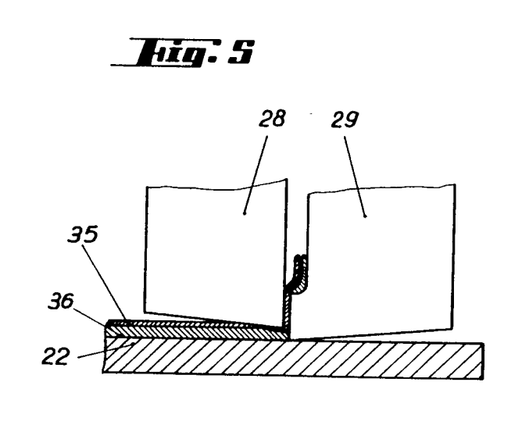
Figure 6:
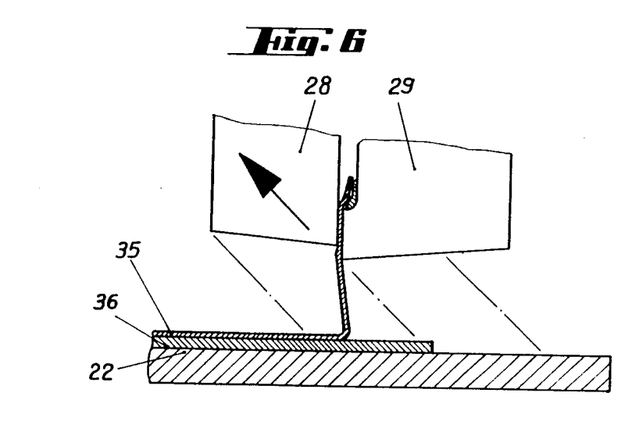

As is best apparent from FIGS. 3 to 6 the nip 30 between the jaws 28 and 29 is defined on one side by a lower horizontal edge 31 of the fixed squeezing jaw 28 and on the other side by a horizontal lower edge 32 of the movable detaching jaw 29. The lower edge 32 is parallel to the lower edge 31. Those surfaces 33 and 34 of the two jaws which face the printed circuit board 22 extend at an acute angle to the surface of the printed circuit board, and to the plane of travel 13. The edge 31 of the fixed squeezing jaw 28 is forced against the protective film 35 close to one corner thereof. The edge 32 of the movable detaching jaw 29 is engaged with the printed circuit board outside the protective film 22 but close to that corner of said film at which the peeling operation is to be initiated. The distance from the edge 32 of the movable detaching jaw 29 to the plane of travel 13 is slightly smaller than the distance from the opposite edge 32 of the fixed squeezing jaw 28 to the plane of travel 13 so that the engagement of the two jaws 28 and 29 with the printed circuit board 22 has the result that the photoresist coating 36 disposed under the protective film 35 is squeezed but the notch-sensitive protective film 35 will not be damaged (FIG. 3). In order to detach the protective film 35, the movable detaching jaw 29 is now pushed against the stationary squeezing jaw 28 so that the movable detaching jaw 29 peels off that corner portion of the protective film 35 which protrudes beyond the fixed squeezing jaw 28 and the photoresist coating 36 disposed under that corner portion (FIG. 4) and finally grips said corner portions of the layers 35 and 36 (FIGS. 5). In that operation the detached corner portion of the photoresist coating is displaced into a free space 37, which is defined between the jaws 28 and 29 by an undercut formed in the movable detaching jaw 29 (FIG. 5). The plate 17 on the upper side and the plate 18 on the underside of the printed circuit board 22 are now pivotally moved to raise the pair of gripping jaws from the printed circuit board so that a portion of the protective film 35 will be peeled off whereas the underlying photoresist coating 36 will not be peeled off but will be torn off where it has been squeezed by the fixed squeezing jaw 28.

Figure 7:
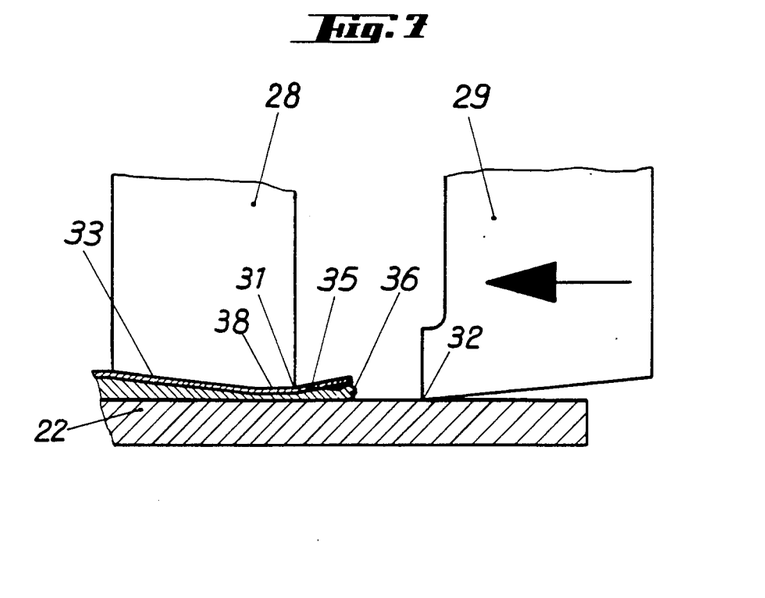
FIGS. 7 and 8 are views which correspond to FIGS. 4 and 5, respectively, but illustrate the use of a somewhat modified pair of gripping jaws.
Figure 8:
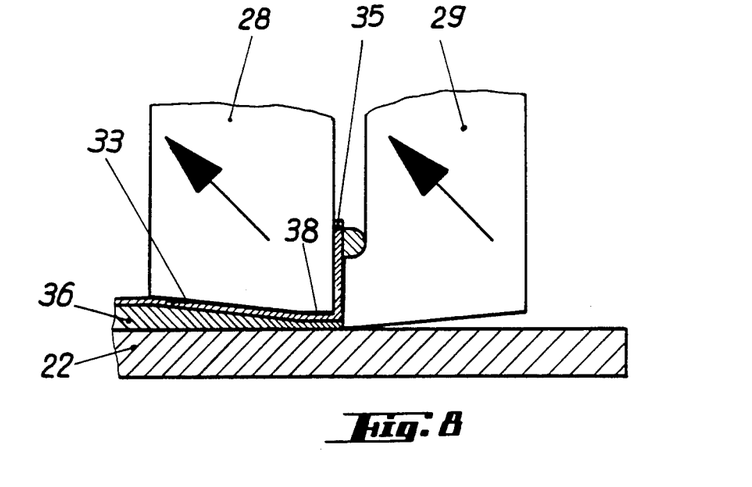

FIGS. 7 and 8 illustrate the use of a somewhat modified pair of gripping jaws for detaching a corner portion of the protective film and of the photoresist coating and for gripping the protective film. The modification resides in that the fixed squeezing jaw 28 has near its lower edge 31 a narrow surface strip 38, which is parallel to the plane of travel 13 and is adjoined by an inclined surface portion 33.

The edges 31 and 32 of the two jaws are not sharp but rounded so that the protective film will not be torn as it is peeled off.

The peeling of the protective film 35 along the guide rail 14 is not completed by the pairs of gripping jaws 11 and 12 but by the separate grippers 16. Only that of said grippers which is disposed above the plane of travel 13 is shown in the drawings. That gripper which is disposed below the plane of travel 13 is designed substantially like the upper gripper 16 and is arranged in mirror symmetry to the latter. FIGS. 9 to 12 illustrate the transfer of the detached corner portion of the protective film 35 from the pair of gripping jaws 11 to the gripper 16. The gripper 16 consists of two forked horizontal pairs of fingers 39 and 40. Each of said pairs of fingers consists of an upper finger 41 having at its free end a downwardly bent hook 43 and of a straight lower finger 32, which is disposed under the finger 41 and has a free end directed toward the hook 43 of the upper finger 41. The upper finger 41 is secured to a carrier 44, which is fixed to the carriage 15. The lower finger 42 is secured to the underside of a block 45, which is secured to a round rod 46, which extends through the carrier 44 and is longitudinally displaceable relative to the latter. A compression spring 47 is disposed between the block 45 and the carrier 44 and urges the lower finger 42 toward and against the hook 43 of the upper finger 41.

Figure 9:
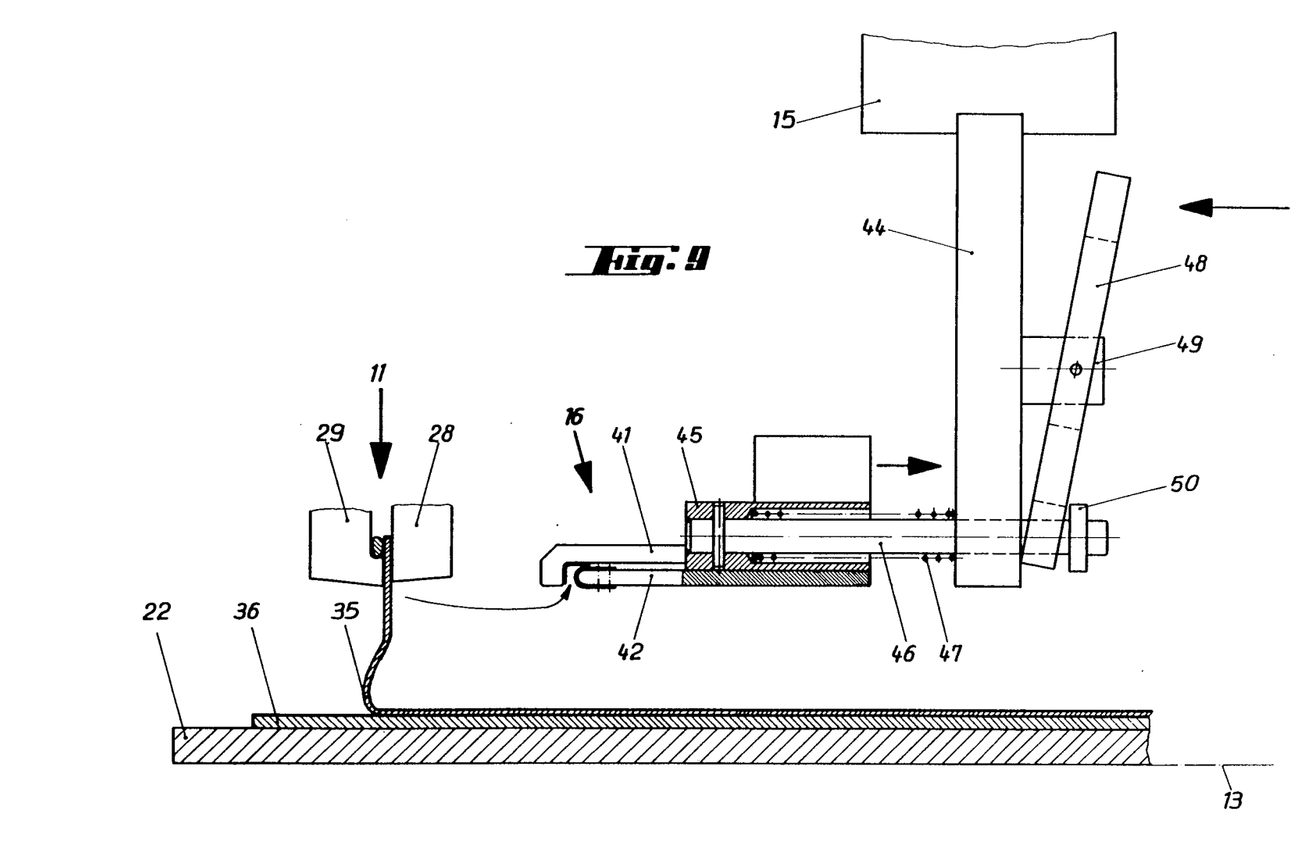
FIGS. 9 and 10 illustrate how the detached corner portion of the protective film is transferred to the gripper.

When the corner portion of the protective film 35 has been detached by the jaws 28 and 29 from the photoresist coating 36 of the printed circuit board 22, the gripper 16 is moved to an end position in which it is close to the pair of gripping jaws 11 (FIG. 9). The pair of gripping jaws 11 are then pivotally raised to move between the two pairs of fingers 39 and 40 of the gripper 16 (FIGS. 11 and 12) so that the corner portion of the protective film 35 is threaded into the now open gap between the fingers 41 and 42. To open the gripper 16 the block 45 may strike against a stationary stop shortly before the gripper 16 reaches its end position. As the block 45 strikes against said stop, the two fingers 39 and 40 are moved apart. Alternatively, the gripper 16 may be opened in that the squeezing jaw 28 strikes against the block 45 and displaces the finger 42.

Figure 10:
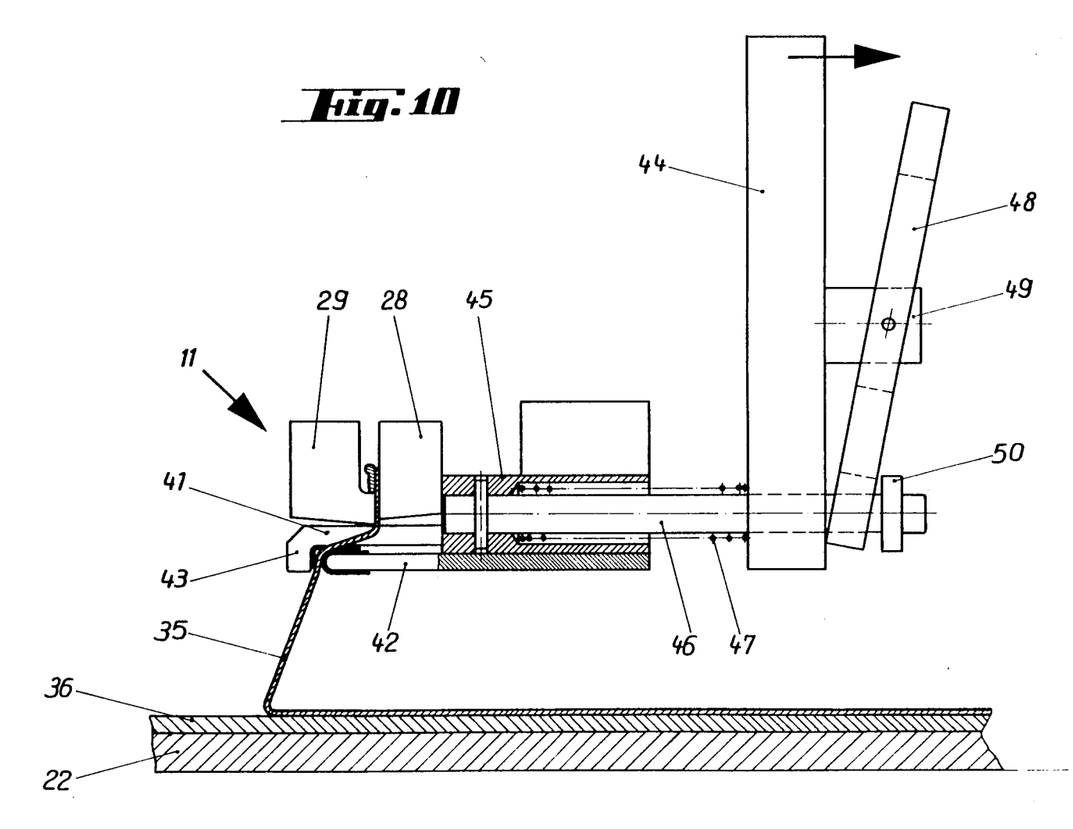
Figure 11:
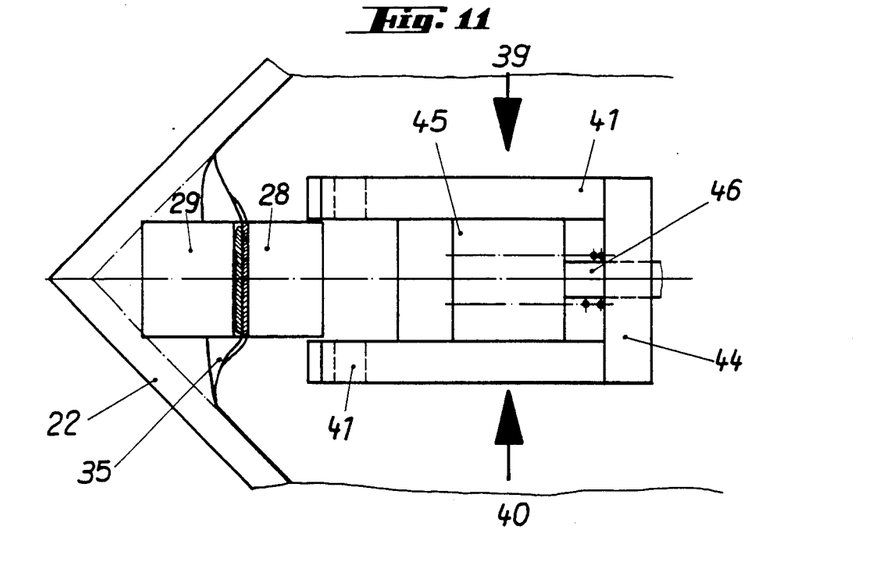
FIGS. 11 and 12 are top plan views showing the elements illustrated in FIGS. 9 and 10.
Figure 12:
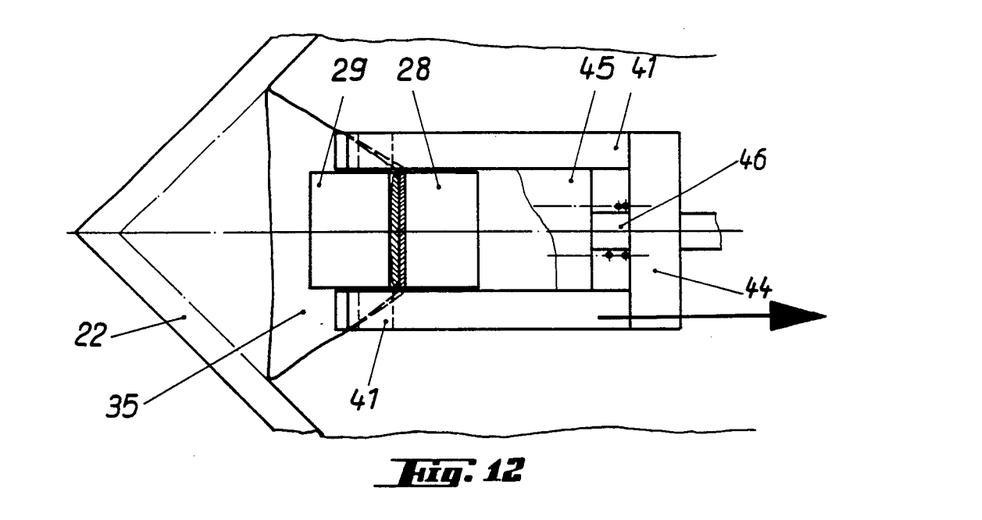

Thereafter the pair of gripping jaws 11 are relieved from pressure but are not opened so that the corner portion of the protective film 35 is still between the gripping jaws 11 but can be pulled out. The carriage 15 is then returned so that the gripper 16 is automatically closed and grips the protective film 35 and pulls it out from between the jaws 28 and 29 and carries the film 35 along and thus peels it from the printed circuit board 22 (FIGS. 10 and 12).

A rocker 48 is mounted on the rear of the carrier 44 for rotation on a horizontal pivot 49. The round rod 46 extends through the lower end of the rocker 48 and has an end portion formed with screw threads screwed into a nut 50, which prevents the lower end of the rocker 48 from leaving the round rod 46.

Shortly before the carriage 15 reaches that end position in which it is disposed outside the area of the roller bed, the upper end of the rocker 48 strikes against an end stop so that a pivotal movement is imparted to the rocker 48 and the gripper 16 is opened. The protective film 35 can now fall freely from the gripper 16 into a collecting bin placed under the gripper 16, which subsequently returns to its receiving position, which is shown in FIG. 9 and in which the gripper 16 can take over and peel off another protective film 35.

With reference to FIG. 2, the means for displacing each detaching jaw 29 toward and away from the associated squeezing jaw 28, which is fixed to the mounting plate 17 or 18, comprise a pneumatic cylinder 29a, which is secured to the underside of the mounting plate 17 or to the upper side of the mounting plate 18. The cylinder 29a contains a piston that is connected by a piston rod, not shown, to the detaching jaw 29. Two parallel guide rods, not shown, are fixed to and protrude from the cylinder 29a on opposite sides of the piston rod and are slidingly guided in two parallel bores 29b formed in the detaching jaw 29 to guide the same as it is moved toward and away from the squeezing jaw 28.

We claim:

1. In a process of peeling a rectangular protective film having diagonally opposite first and second corners from a photoresist coating which is provided on one side of printed circuit board and has a corner in register with said first corner of said protective film, said printed circuit board having on said one side a surface portion which protrudes from said photoresist coating at said corner thereof, wherein said peeling of said protective film is initiated at said first corner and is continued as far as to said second corner, inclusive, the improvement residing in that said printed circuit board is held in a predetermined position, a first gripping member is forced against said protective film adjacent to said first corner so as to form in said photoresist coating under said protective film a squeezed portion adjacent to but spaced from said first corner, a second gripping member is engaged with said protruding surface portion adjacent to said first corner and is then moved toward said first gripping member so as to define a nip with said first gripping member and to detach from said printed circuit board a corner portion of said protective film and a corner portion of said photoresist coating between said first corner and said squeezed portion and to grip said corner portions in said nip, said corner portions of said protective film and of said photoresist coating are moved to tear said corner portion of said photoresist coating from the remainder of said corner portion of said photoresist coating, and said corner portion of said protective film is subsequently moved in a peeling direction over and beyond said second corner to peel said protective film, inclusive of said second corner, from said remainder of said photoresist coating.

2. Apparatus for peeling a rectangular protective film having diagonally opposite first and second corners from a photoresist coating which is provided on one side of printed circuit board and has a corner in register with said first corner of said protective film, said printed circuit board having on said one side a surface portion which protrudes from said photoresist coating at said corner thereof, which apparatus comprises peeling means for initiating said peeling of said protective film at said first corner and for continuing said peeling as far as to said second corner, inclusive, the improvement residing in that said apparatus comprises a board-clamping device for clamping said printed circuit board and for holding it in a predetermined position, said peeling means comprise first and second gripping members for initiating said peeling at said first corner, actuating means for forcing said first gripping member against said protective film adjacent to said first corner so as to form in said photoresist coating under said protective film a squeezed portion adjacent to but spaced from said first corner and for moving said second gripping member into engagement with said protruding surface portion adjacent to said first corner and for subsequently moving said second gripping member toward said first gripping member so as to define a nip with said first gripping member and to detach from said printed circuit board a corner portion of said protective film and a corner portion of said photoresist coating between said first corner and said squeezed portion and to grip said corner portions in said nip and means for moving said corner portions of said protective film and of said photoresist coating away from said printed circuit board so as to tear said corner portion of said photoresist coating at said squeezed portion from the remainder of said photoresist coating, and for subsequently moving said corner portion of said protective film in a peeling direction over and beyond said second corner to peel said protective film, inclusive of said second corner, from said remainder of said photoresist coating.

3. The improvement set forth in claim 2 as applied to apparatus comprising a conveyor, which defines a plane of travel and is operable to move each of a plurality of consecutive printed circuit boards on said plane of travel in a direction of travel toward said predetermined position, wherein said first and second gripping members comprise at least one squeezing jaw and at least one detaching jaw, respectively, which are movable in unison toward and away from said plane of travel by movements having components opposite to and in said peeling direction, respectively, said peeling means comprise jaw-closing means for holding said squeezing jaw in contact with said protective film against a movement in said peeling direction and for moving said detaching jaw in contact with said printed surface board in said peeling direction into engagement with said squeezing jaw so as to detach said corner portion of said photoresist coating from said printed circuit board and to force said corner portions of said photoresist coating and of said protective film against said squeezing jaw.

4. The improvement set forth in claim 3, wherein each of said squeezing and detaching jaws has a board-engaging edge, which is parallel to said plane of travel and transverse to said peeling direction and engageable with said printed circuit board when the latter is in said predetermined position, each of said squeezing and peeling jaws comprises first and second edge-defining surfaces defining said board-engaging edge, said first edge-defining surfaces face each other and define a nip for gripping said corner portions, and said second edge-defining surfaces face said plane of travel.

5. The improvement set forth in claim 4, wherein said second edge-defining surface of said detaching jaw tapers in said peeling direction relative to said plane of travel.

6. The improvement set forth in claim 4, wherein at least one of said squeezing and detaching jaws is formed in its said edge-defining surface with an undercut.

7. The improvement set forth in claim 4, wherein said board-engaging edges are rounded.

8. The improvement set forth in claim 4, wherein said squeezing and peeling jaws are coupled to be movable in unison toward and away from said plane of travel and said board-engaging edge of said detaching jaw is arranged to be closer to said plane of travel than said board-engaging edge of said squeezing jaw when both said board-engaging edges contact said printed circuit board.

9. The improvement set forth in claim 8, wherein said board-engaging edge of said detaching jaw is closer to said plane of travel by the thickness of said protective film than said board-engaging edge of said squeezing jaw when both said board-engaging edges contact said printed circuit board.

10. The improvement set forth in claim 4, wherein said second edge-defining surface of said squeezing jaw has a first surface portion which adjoins and extends along said board-engaging edge and a second surface portion which tapers toward and adjoins said first surface portion on the side thereof which is opposite to said board-engaging edge.

11. The improvement set forth in claim 3, wherein said jaw-closing means are operable to move said detaching jaw parallel to said plane of travel into engagement with said squeezing jaw.

12. The improvement set forth in claim 3, wherein said squeezing and detaching jaws are pivoted to parallel links, which are pivoted at a distance from said jaws on respective pivotal axes, which are parallel to said plane of travel and transverse to said peeling direction, and said links are pivotally movable to impart to said squeezing and detaching jaws a pivotal movement while holding said squeezing and detaching jaws in a predetermined orientation.

13. The improvement set forth in claim 3, wherein said peeling means comprise a gripper, which is disposed on that side of said squeezing jaw which is opposite to said detaching jaw, said actuating means are adapted to move said squeezing and detaching jaws away from said plane of travel to a transfer position so as to tear said corner portion of said photoresist coating from the remaining portion of said photoresist coating at said squeezed portion, said gripper is reciprocable in and opposite to said peeling direction from and to a receiving position, in which said gripper is adjacent to said squeezing jaw in said transfer position and adapted to take over from said nip and to grip said corner portion of said protective film, and said gripper is movable from said receiving position in said peeling direction so as to move said corner portion of said protective film over and beyond said second corner thereof so that said protective film is peeled from said remaining portion of said photoresist coating.

14. The improvement set forth in claim 13, wherein said gripper comprises two forked pairs of fingers arranged to extend on opposite sides of said squeezing and detaching jaws when the latter are in said transfer position and the gripper is in said receiving position.

15. The improvement set forth in claim 13, wherein said conveyor comprises a plurality of rollers having horizontal axes and defining a common horizontal tangential plane which constitutes said plane of travel, said rollers constitute first and second sets of rollers, said first and second sets of rollers defining between them a gap extending in said peeling direction, said squeezing and detaching jaws and said gripper are disposed above said plane of travel, said peeling means comprise a second squeezing jaw, a second detaching jaw, and a second gripper, which are disposed on the underside of said plane of travel and operable to peel a second rectangular protective film having diagonally opposite first and second corners from a second photoresist coating, which is provided on the opposite side of said printed circuit board and has a corner in register with said first corner of said second protective film, said printed circuit board having on said opposite side a surface portion which protrudes from said second photoresist coating at said corner thereof, and said second gripper extends in and is movable along said gap.

16. The improvement set forth in claim 13, wherein said gripper is movable in said peeling direction to a point which is disposed laterally outwardly of said conveyor.

17. The improvement set forth in claim 3, wherein said board-clamping device is movable along said conveyor and adapted to be fixed in position against a movement along said conveyor.

18. The improvement set forth in claim 3 as applied to apparatus in which said conveyor is operable to support said printed circuit board in a position in which an edge portion of said printed circuit board is parallel to said direction of travel, wherein said board-clamping device is operable to engage said printed circuit board adjacent to said squeezing and detaching jaws near said edge which is parallel to said direction of travel.

19. The improvement set forth in claim 3, wherein said conveyor comprises a plurality of rollers having horizontal axes and defining a common horizontal tangential plane which constitutes said plane of travel.

20. The improvement set forth in claim 3, wherein said board-clamping device is operable to raise said printed circuit board at a small distance above said plane of travel when said printed circuit board is clamped by said board-clamping device.

* * * * *